United States Patent
Takeda et al.

(10) Patent No.: US 6,914,182 B2
(45) Date of Patent: Jul. 5, 2005

(54) METHOD OF INSTALLING SOLAR CELL MODULES, AND SOLAR CELL MODULE

(75) Inventors: Katsutoshi Takeda, Katano (JP); Toshihiro Kinoshita, Katano (JP)

(73) Assignee: Sanyo Electric Co., Ltd, Osaka (JP)

( * ) Notice: Subject to any disclaimer, the term of this patent is extended or adjusted under 35 U.S.C. 154(b) by 0 days.

(21) Appl. No.: 09/902,774

(22) Filed: Jul. 10, 2001

(65) Prior Publication Data

US 2002/0017900 A1 Feb. 14, 2002

(30) Foreign Application Priority Data

Jul. 10, 2000 (JP) .................................. 2000-208804
Aug. 25, 2000 (JP) .................................. 2000-256236

(51) Int. Cl.$^7$ .................... H01L 31/042; H01L 31/048; H01L 31/05; H01L 31/18
(52) U.S. Cl. ...................... 136/244; 136/251; 136/259; 136/291; 52/173.3; 438/64; 438/66; 438/67; 438/68; 438/80; 257/433; 257/443
(58) Field of Search .................... 136/244, 251, 136/259, 291; 52/173.3; 257/433, 443; 438/66, 64, 67, 68, 80

(56) References Cited

U.S. PATENT DOCUMENTS

| | | | | |
|---|---|---|---|---|
| 4,089,705 A | * | 5/1978 | Rubin | 136/244 |
| 4,131,123 A | * | 12/1978 | Della-Vedowa et al. | 136/251 |
| 4,321,416 A | * | 3/1982 | Tennant | 136/244 |
| 4,877,460 A | * | 10/1989 | Flodl | 136/244 |
| 5,575,861 A | * | 11/1996 | Younan et al. | 136/251 |
| 5,733,382 A | * | 3/1998 | Hanoka | 136/251 |
| 5,928,437 A | * | 7/1999 | Dillard | 136/244 |
| 6,080,998 A | * | 6/2000 | Shima et al. | 257/55 |
| 6,128,868 A | * | 10/2000 | Ohtsuka et al. | 52/173.3 |
| 6,357,649 B1 | * | 3/2002 | Okatsu et al. | 228/179.1 |
| 6,525,262 B1 | * | 2/2003 | Makita et al. | 136/244 |
| 6,552,258 B2 | * | 4/2003 | Kinoshita et al. | 136/251 |

FOREIGN PATENT DOCUMENTS

| | | | | |
|---|---|---|---|---|
| JP | 10082152 A | * | 3/1998 | ........... E04D/13/18 |
| JP | 11-195803 | | 7/1999 | |
| JP | 11195803 A | * | 7/1999 | ......... H01L/31/042 |
| JP | 11-299126 | | 10/1999 | |
| JP | 11-340488 A | * | 12/1999 | |

OTHER PUBLICATIONS

English Translation of Abstract of Japanese Application No. 11–299126 dated Oct. 29, 1999.

English Translation of Abstract of Japanese Application No. 11–195803 dated Jul. 21, 1999.

* cited by examiner

*Primary Examiner*—Alan Diamond
(74) *Attorney, Agent, or Firm*—Darby and Darby

(57) ABSTRACT

Two types of solar cell modules having an equal output voltage and different sizes are used, and a plurality of solar cell modules of these two types are installed so that they are connected in parallel. The size of a solar cell module having two solar cell sub-modules is two times larger than the size of a solar cell module including one solar cell sub-module. By connecting two power generating regions of each of the solar cell sub-modules of the former solar cell module in parallel, connecting adjacent two solar cell sub-modules in series and connecting two power generating regions of the solar cell sub-module of the latter solar cell module in series, an equal output voltage is obtained from both of the solar cell modules.

4 Claims, 13 Drawing Sheets

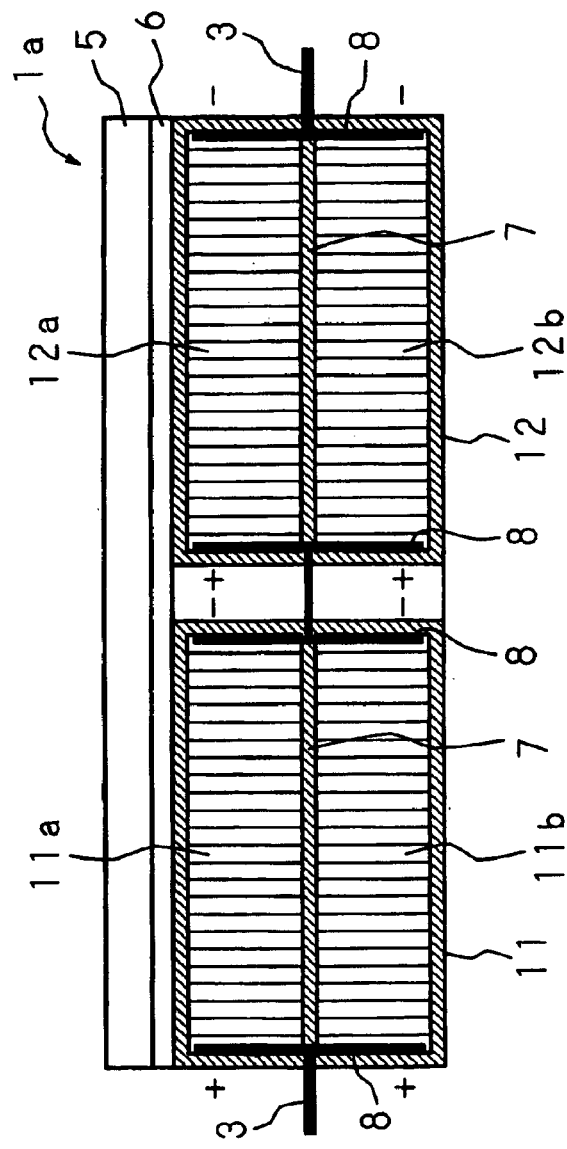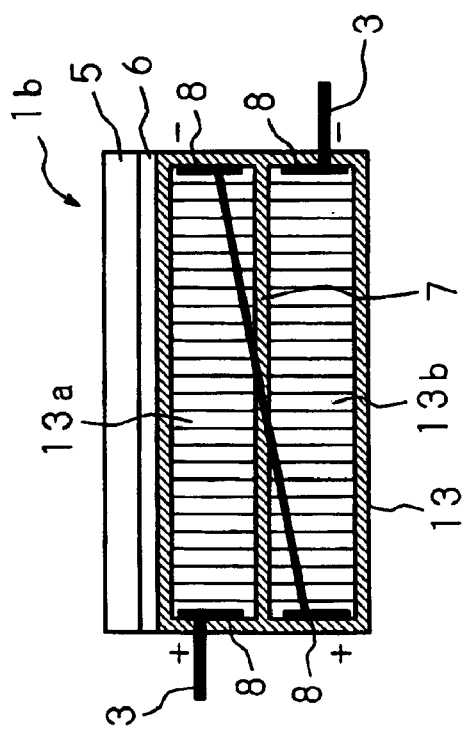
FIG. 6A
FIG. 6B

US 6,914,182 B2

METHOD OF INSTALLING SOLAR CELL MODULES, AND SOLAR CELL MODULE

BACKGROUND OF THE INVENTION

The present invention relates to a method of installing a plurality of solar cell modules on an installation surface, such as the roof of a house, for photovoltaic power generation, and also relates to a solar cell module for use in a photovoltaic power generation system, particularly solar cell modules installed stepwise on buildings such as a house.

Photovoltaic power generation for converting light energy into electrical energy by using a photoelectric conversion effect has been widely used as means for obtaining clean energy. Besides, with an improvement of the photoelectric conversion efficiency of solar cells, the number of private houses using a photovoltaic power generation system has been increasing.

FIG. 1 is an illustration showing an ordinary structure of a photovoltaic power generation system. In FIG. 1, numeral 101 is a solar cell module designed to provide a predetermined output voltage by connecting a plurality of solar cells in series. A pair of positive and negative output lines of each of these solar cell modules 101 is connected to a pair of positive and negative trunk cables 103. Moreover, connected to this trunk cable 103 is an inverter 104 for converting a DC output of the solar cell modules 101 into an AC output and outputting the AC output. Accordingly, with a structure where a plurality of the solar cell modules 101 are connected in parallel, even if a part of the solar cell modules 101 is broken, it is possible to prevent the entire system from being infeasible.

FIG. 2 is a schematic view showing a conventional example of installation of a plurality of solar cell modules 101. According to prior arts, as shown in FIG. 2, pieces of solar cell modules 101 having an equal output voltage and an equal size, which are necessary for obtaining a required electric energy, are installed so that they are connected in parallel.

The conventional installation method suffers from the following problems. Since the conventional method uses the solar cell modules of a fixed size, an extremely large number of solar cell modules must be installed for constructing a high-power photovoltaic power generation system and thus the number of processes to be performed for wiring increases and the total construction time is extremely long, and the construction cost also increases as an increased number of parts such as terminal boxes is required. Moreover, since only solar cell modules of an equal size can be used, a plurality of solar cell modules can not be installed efficiently according to an installation surface.

By the way, regarding the structures of solar cell modules for use in the photovoltaic power generation systems, although various types of structures have been known, solar cell modules using a metal base such as a stainless steel plate as a rear-side base are suitable for a photovoltaic power generation system for private houses because the metal base can be used as it is for the roof material.

FIG. 3 is a plan view showing the structure of a conventional example of such a solar cell module, and FIG. 4 is a cross section cut along the A—A line of FIG. 3. In these figures, numeral 111 is a metal base made of stainless steel, for example. Two solar cell sub-modules 112 are mounted on the front surface of the metal base 111. Each solar cell sub-module 112 comprises a glass substrate and a plurality of solar cells arranged on the glass substrate, and is mounted on the front surface of the metal base 111 through an EVA resin. In each solar cell sub-module 112, the plurality of solar cells are electrically connected to each other, and one positive wire 113 and one negative wire 113 are drawn from each of the solar cell sub-modules 112.

A raised portion 122 having a first engagement section 121 at its end is formed at one edge of the metal base 111 where the solar cell sub-modules 112 are not mounted (the ridge-side edge when a plurality of solar cell modules are installed stepwise) by bending the metal base 111, and a suspended portion 124 having a second engagement section 123 at its end is formed at the opposing other edge (the eave-side edge when a plurality of solar cell modules are installed stepwise) by bending the metal base 111. Further, in the process of actually installing a plurality of solar cell modules, the first engagement section 121 of the solar cell module positioned on the eave side is brought into engagement with the second engagement section 123 of the solar cell module positioned on the ridge side.

The raised portion 122 includes a base section 125 formed by bending the metal base 111 so that the base section 125 is parallel to the front surface of the metal base 111, and terminal boxes 115 are mounted on both end portions of this base section 125. The positive wire 113 of one of the solar cell sub-modules 112 is connected to a power cable (not shown) in one of the terminal boxes 115, and the negative wire 113 of the other solar cell sub-module 112 is connected to the power cable in the other terminal box 115. The negative wire 113 of the one solar cell sub-module 112 and the positive wire 113 of the of the solar cell sub-module 112 are connected through a member 116 at an upper part of the front surface of the metal base 111. This wiring member 116 is coated with an insulated tape so as to be insulated from the metal base 111, and is further sealed in an EVA resin layer so as not to be exposed to outside air directly. With the connection as mentioned above, the power generated by the solar cells of the respective solar cell sub-modules 112 is outputted.

In the conventional example, the wiring member for connecting the solar cell sub-modules to each other is sealed in the EVA resin layer so that it is shielded from outside air and has weather resistance, but it is hard to obtain long-term reliability by means of only the EVA resin layer.

BRIEF SUMMARY OF THE INVENTION

An object of the present invention is to provide a solar cell module installation method capable of reducing the time and cost of constructing a photovoltaic power generation system and of realizing efficient installation according to an installation surface.

Another object of the present invention is to provide a solar cell module capable of obtaining long-term reliability.

A solar cell module installation method according to the first aspect is a method of installing a plurality of solar cell modules, wherein a plurality of types of solar cell modules having an equal output voltage and different sizes are installed so that they are connected in parallel. In other words, a plurality of types of solar cell modules that have an equal output voltage but have different sizes are installed in combination. Accordingly, by using large-size solar cell modules, it is possible to reduce the number of pieces of solar cell modules to be installed, shorten the construction time of a photovoltaic power generation system, decrease the number of parts such as terminal boxes and reduce the construction cost. Further, since solar cell modules having a size suitable for an installation space can be used, it is possible to realize efficient installation of the solar cell modules according to an installation surface.

A solar cell module installation method according to the second aspect is based on the first aspect, wherein the plurality of types of solar cell modules comprise mutually different numbers of solar cell sub-modules of an equal size. In other words, the sizes of the plurality of types of solar cell modules are varied according to the number of solar cell sub-modules included in the solar cell modules, respectively. Hence, since the ratio of the sizes of the plurality of types of solar cell modules is a simple integer ratio, even when these solar cell modules are installed in combination, they can be installed efficiently without a gap.

A solar cell module installation method according to the third aspect is based on the first or second aspect, wherein the plurality of types of solar cell modules have mutually different internal wiring designs so as to obtain an equal output voltage. In other words, by varying their internal wiring designs, the same output voltage is obtained from the plurality of types of solar cell modules of different sizes. Accordingly, it is possible to achieve the same output voltage by simple wiring manners.

A solar cell module installation method according to the fourth aspect is based on the second aspect, wherein the solar cell sub-modules in the plurality of types of solar cell modules respectively comprise a plurality of power generating regions, and the plurality of power generating regions are connected in series or in parallel so that the plurality of types of solar cell modules obtain an equal output voltage. In other words, by connecting the plurality of power generating regions constituting the respective solar cell sub-modules in series or in parallel, the same output voltage is obtained from the plurality of types of solar cell modules of different sizes. Accordingly, it is possible to achieve the same output voltage by simple wiring manners.

A solar cell module according to the fifth aspect is a solar cell module comprising a supporting member; and a plurality of solar cell sub-modules mounted on the supporting member, each of the solar cell sub-modules including a plurality of solar cells, the solar cell sub-modules positioned next to each other being electrically connected to each other by a wiring member on the supporting member, wherein the solar cell module comprises a moisture impermeable cover member for covering the wiring member. In other words, the wiring member for electrically connecting adjacent solar cell modules to each other is sealed in between the supporting member and the moisture impermeable cover member. Accordingly, since the upper and lower portions of the wiring member are covered with the supporting member and the cover member, respectively, the area exposed to outside air is reduced as compared to conventional examples, thereby improving the long-term reliability in respect of ambient environment resistance.

A solar cell module according to the sixth aspect is a solar cell module comprising a metal base; a plurality of solar cell sub-modules mounted on the metal base, each of the solar cell sub-modules including a plurality of solar cells; a raised portion which is provided at one of opposing side edges of the metal base and has a first engagement section at its end; and a suspended portion which is provided at the other side edge and has at its end a second engagement section that comes into engagement with the first engagement section of other solar cell module, the solar cell sub-modules positioned next to each other being electrically connected to each other by a wiring member on the metal base, wherein the raised portion has a base section provided parallel to a surface of the metal base, and the connection of the solar cell sub-modules by the wiring member is made between the metal base and the base section. In other words, the wiring member for electrically connecting adjacent solar cell modules to each other is sealed in between the metal base as a supporting member and the base section of the raised portion for fitting the solar cell module into adjacent solar cell module. Accordingly, since the upper and lower portions of the wiring member are covered with the metal base and the base section, respectively, the area exposed to outside air is reduced as compared to conventional examples, thereby improving the long-term reliability in respect of ambient environment resistance.

The above and further objects and features of the invention will more fully be apparent from the following detailed description with accompanying drawings.

BRIEF DESCRIPTION OF THE SEVERAL VIEWS OF THE DRAWINGS

FIGS. 6A and 6B are illustrations showing the structures of two types of solar cell modules of the first embodiment for use in the solar cell module installation method of the present invention;

DETAILED DESCRIPTION OF THE INVENTION

The following description will explain the present invention in detail with reference to the drawings illustrating some embodiments thereof.

Figure 5:
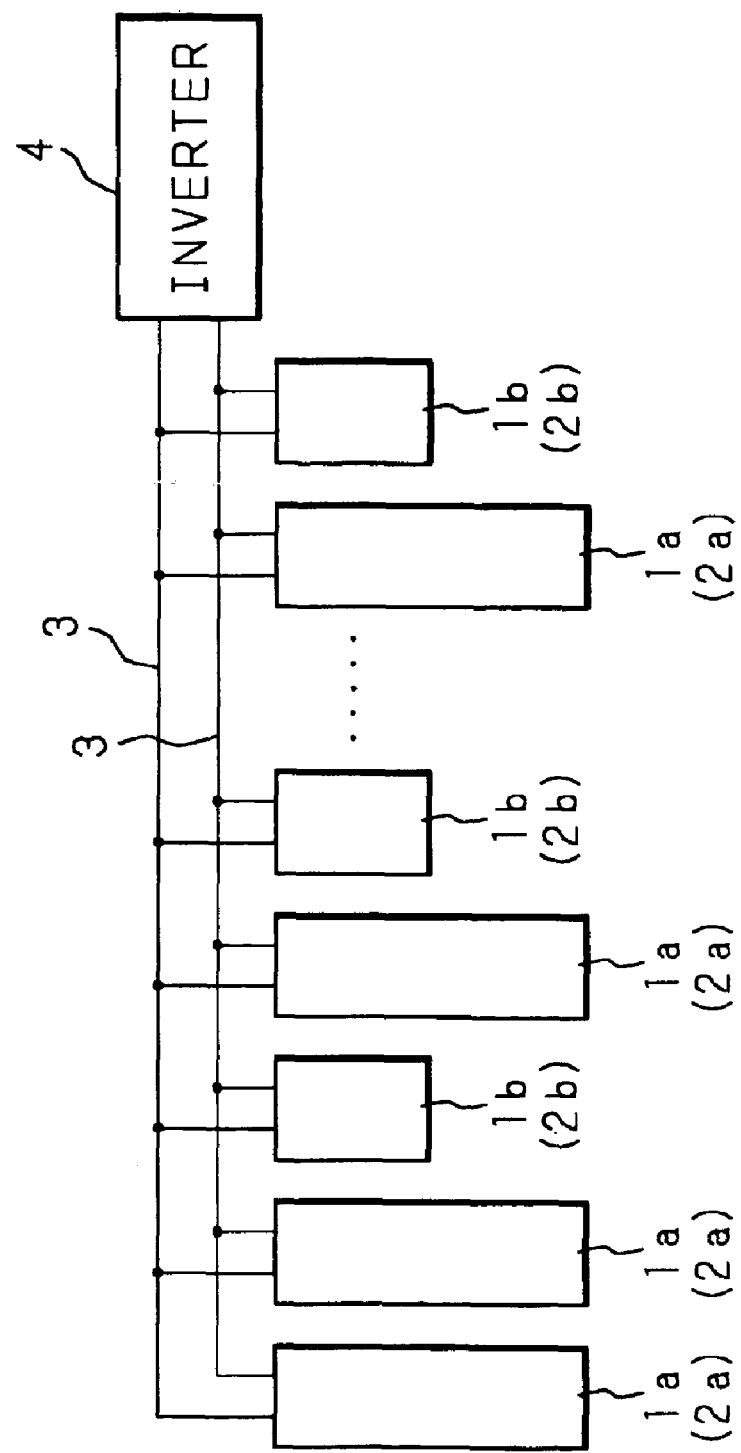
FIG. 5 is an illustration showing an ordinary structure of a photovoltaic power generation system employing a solar cell module installation method of the present invention.

FIG. 5 is an illustration showing an ordinary structure of a photovoltaic power generation system employing a solar cell module installation method of the present invention. In FIG. 5, 1*a* (2*a*) and 1*b* (2*b*) represent solar cell modules whose output voltages are equal to each other and whose sizes are different from each other. The structures of the solar cell modules 1*a* (2*a*) and 1*b* (2*b*) will be described in detail later. A pair of positive and negative output lines of each of these solar cell modules 1*a* (2*a*) and 1*b* (2*b*) is connected to a pair of positive and negative trunk cables 3. Moreover, connected to the trunk cables 3 is an inverter 4 for converting a DC output of the solar cell modules 1*a* (2*a*) and 1*b* (2*b*) into an AC output and outputting the AC output.

(First Embodiment)

FIGS. 6A and 6B are illustrations showing the structures of two types of solar cell modules of the first embodiment for use in a solar cell module installation method of the present invention.

The solar cell module 1*a* shown in FIG. 6A is constructed by mounting two solar cell sub-modules 11 and 12 side by side on a steel plate 5 functioning as a support. In an area where the solar cell sub-modules 11 and 12 are not mounted, an engagement section 6 for engaging this solar cell module 1*a* with another solar cell module is formed unitedly by bending the steel plate 5.

The solar cell sub-modules 11 and 12 are divided into two power generating regions 11*a* and 11*b* or 12*a* and 12*b* by a laser separated portion 7. Each of these power generating regions 11*a*, 11*b*, 12*a* and 12*b* is constructed by connecting a plurality of solar cells in series so as to obtain a predetermined output voltage. The two power generating regions 11*a* and 11*b* of the solar cell sub-module 11 are connected in parallel, and the two power generating regions 12*a* and 12*b* of the solar cell sub-module 12 are also connected in parallel. Further, a positive wire 8 of the solar cell sub-module 11 is connected to the positive trunk cable 3, a negative wire 8 of the solar cell sub-module 12 is connected to the negative trunk cable 3, and a negative wire 8 of the solar cell sub-module 11 and a positive wire 8 of the solar cell sub-module 12 are connected to each other.

On the other hand, the solar cell module 1*b* shown in FIG. 6B is constructed by mounting one solar cell sub-module 13 on a steel plate 5. The size of this solar cell sub-module 13 is the same as the size of each of the solar cell sub-modules 11 and 12. In an area where the solar cell sub-module 13 is not mounted, an engagement section 6 for engaging this solar cell module 1*b* with another solar cell module is formed unitedly by bending the steel plate 5.

The solar cell sub-module 13 is divided into two power generating regions 13*a* and 13*b* by a laser separated portion 7. Each of the power generating regions 13*a* and 13*b* is constructed by connecting a plurality of solar cells in series so as to obtain a predetermined output voltage. The number of the solar cells connected in series in each of the power generating regions 13*a* and 13*b* is the same as that in each of the power generating regions 11*a*, 11*b*, 12*a* and 12*b*, and the output voltage of each of the power generating regions 13*a* and 13*b* is the same as that of each of the power generating regions 11*a*, 11*b*, 12*a* and 12*b*. A positive wire 8 of one power generating region 13*a*, is connected to the positive trunk cable 3, a negative wire 8 of the other power generating region 13*b* is connected to the negative trunk cable 3, and a negative wire 8 of the power generating region 13*a* and a positive wire 8 of the power generating region 13*b* are connected to each other.

According to the structures as mentioned above, the size of the solar cell module 1*a* of FIG. 6*a* including two solar cell sub-modules 11 and 12 is two times larger than the size of the solar cell module 1*b* of FIG. 6B including one solar cell sub-module 13. Moreover, in the solar cell module 1*a*, each set of two power generating regions 11*a*, 11*b* and 12*a*, 12*b* is connected in parallel and adjacent two solar cell sub-modules 11 and 12 are connected in series; whereas the solar cell module 1*b* includes two power generating regions 13*a* and 13*b* connected in series, so that the same output voltage is obtained from both of the solar cell modules 1*a* and 1*b*.

Figure 1:
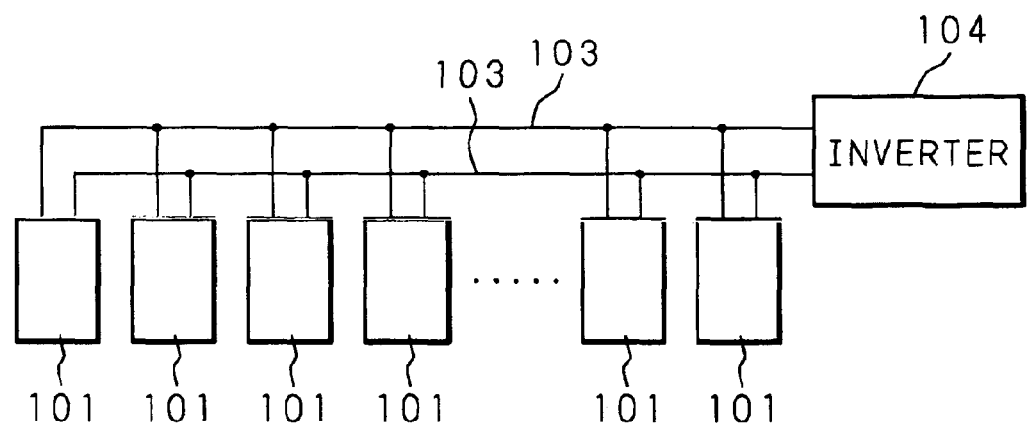
FIG. 1 is an illustration showing an ordinary structure of a photovoltaic power generation system.
Figure 2:
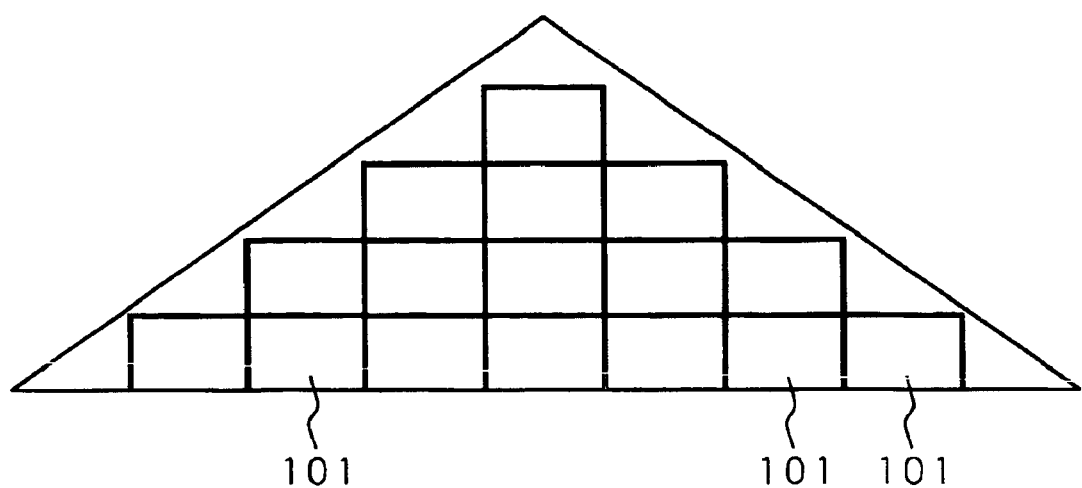
FIG. 2 is a schematic view of a conventional example of installation of a plurality of solar cell modules.
Figure 3:
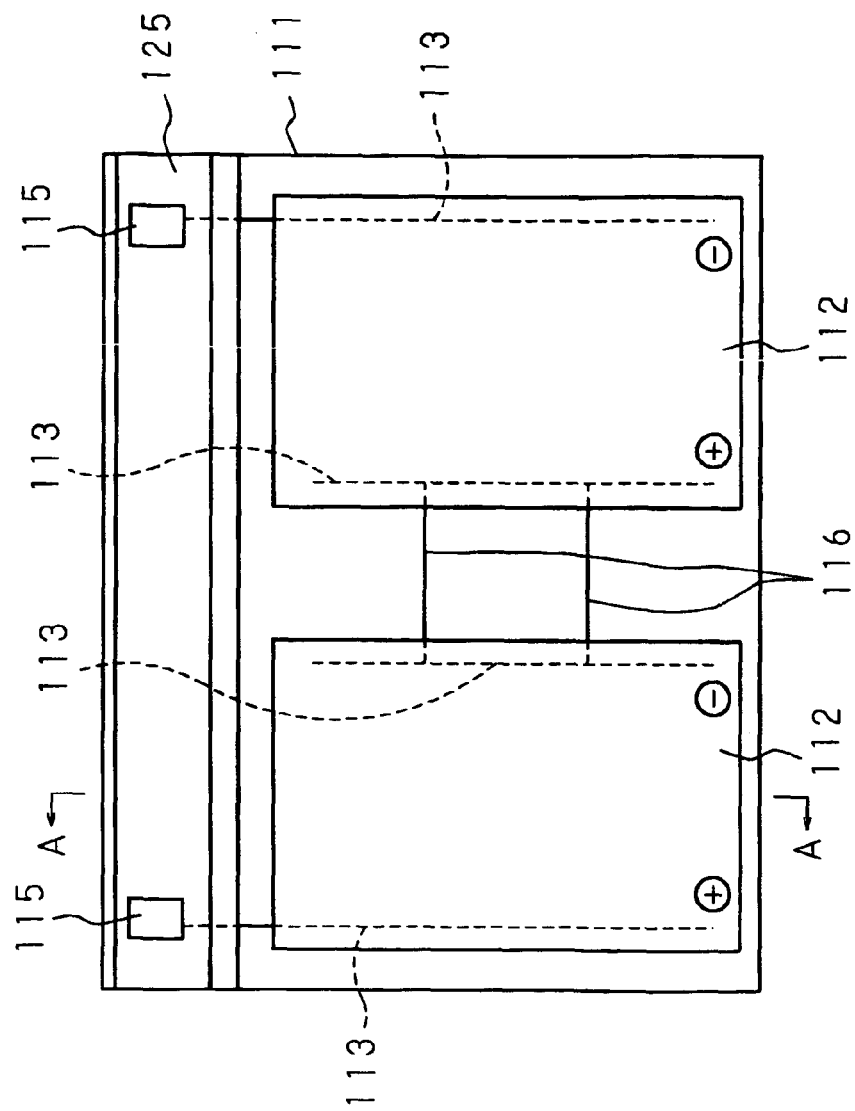
FIG. 3 is a plan view showing the structure of a solar cell module of the conventional example.
Figure 4:
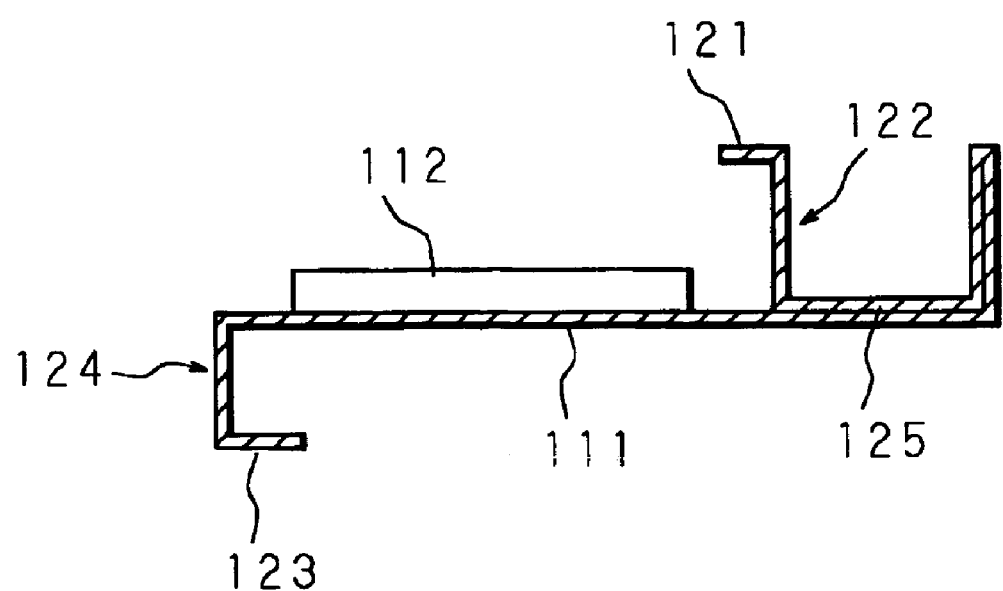
FIG. 4 is a cross section cut along the A—A line of FIG. 3.
Figure 7:
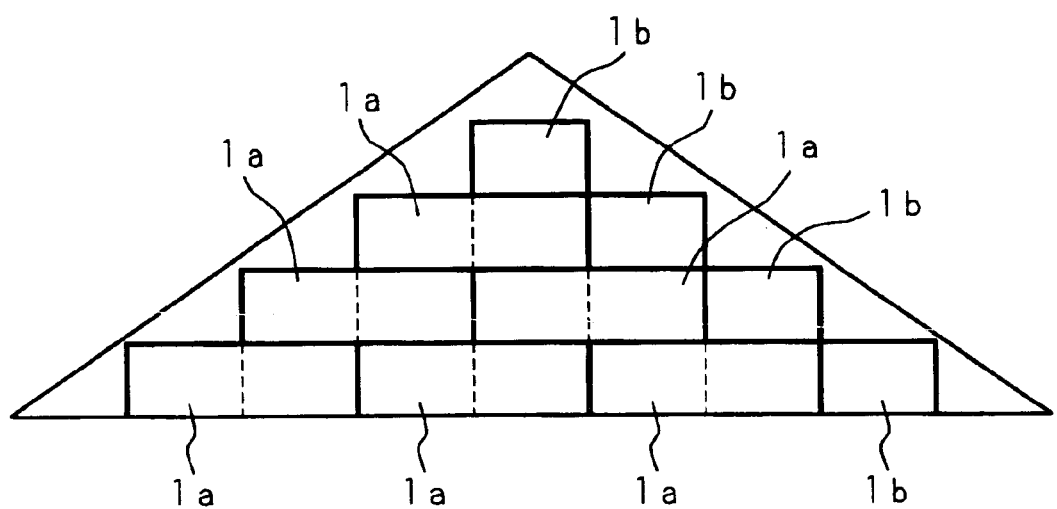
FIG. 7 is an illustration showing an installation example in which the two types of solar cell modules of the first embodiment are installed in a lateral direction of a roof.

FIG. 7 is an illustration showing an installation example in which the above-described two types of solar cell modules 1*a* and 1*b* are installed in a lateral direction of a roof (a direction orthogonal to a ridge-eave direction). As shown in FIG. 7, the solar cell modules 1*a* of a larger size are successively installed in a lateral direction and the solar cell module 1*b* of a smaller size is installed at the end. By installing the solar cell modules 1*a* and 1*b* in such a manner, in comparison with a conventional example (FIG. 2), the time required for the installation process can be shortened because the number of the solar cell modules to be installed can be decreased and the cost can also be reduced because the number of parts such as terminal boxes is decreased. In addition, since the solar cell module 1*b* of a smaller size can be provided at the end in combination with the solar cell modules 1*a*, it is possible to achieve efficient installation without wasting the installation area as compared to the conventional example (FIG. 2).

(Second Embodiment)

Figure 8A:
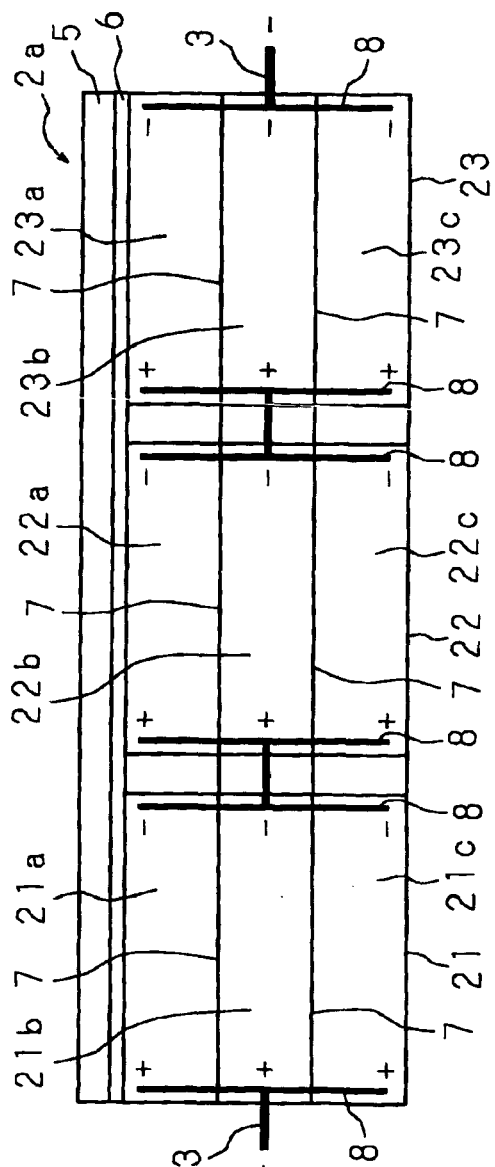
FIGS. 8A and 8B are illustrations showing the structures of two types of solar cell modules of the second embodiment for use in the solar cell module installation method of the present invention.
Figure 8B:
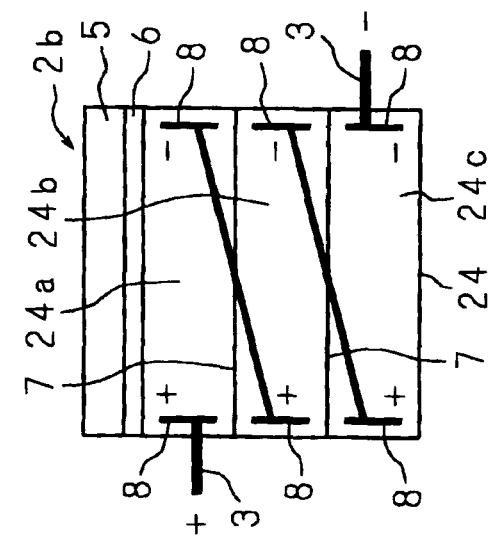

FIGS. 8A and 8B are illustrations showing the structures of two types of solar cell modules of the second embodiment for use in a solar cell module installation method of the present invention.

The solar cell module 2*a* shown in FIG. 8A is constructed by mounting three solar cell sub-modules 21, 22 and 23 side by side on a steel plate 5. In an area where the solar cell sub-modules 21, 22 and 23 are not mounted, an engagement section 6 for engaging this solar cell module 2*a* with another solar cell module is formed unitedly by bending the steel plate 5.

Each of the solar cell sub-modules 21, 22 and 23 is divided into three power generating regions 21*a*, 21*b* and 21*c*, 22*a*, 22*b* and 22*c*, or 23*a*, 23*b* and 23*c* by laser separated portions 7. Each of these power generating regions 21*a* through 23*c* is constructed by connecting a plurality of solar cells in series so as to obtain a predetermined output voltage. The three power generating regions 21*a*–21*c*, 22*a*–22*c* and 23*a*–23*c* of the solar cell sub-module 21, 22 and 23 are respectively connected in parallel. Further, a positive wire 8 of the solar cell sub-module 21 is connected to the positive trunk cable 3, a negative wire 8 of the solar cell sub-module 23 is connected to the negative trunk cable 3, a negative wire 8 of the solar cell sub-module 21 and a positive wire 8 of the solar cell sub-module 22 are connected to each other, and a negative wire 8 of the solar cell sub-module 22 and a positive wire 8 of the solar cell sub-module 23 are connected to each other.

On the other hand, the solar cell module 2*b* shown in FIG. 8B is constructed by mounting one solar cell sub-module 24 on a steel plate 5. The size of this solar cell sub-module 24 is the same as the size of each of the solar cell sub-modules 21, 22 and 23. In an area where the solar cell sub-module 24 is not mounted, an engagement section 6 for engaging this solar cell module 2*b* with another solar cell module is formed unitedly by bending the steel plate 5.

The solar cell sub-module 24 is divided into three power generating regions 24*a*, 24*b* and 24*c* by laser separated portions 7. Each of the power generating regions 24*a*, 24*b* and 24*c* is constructed by connecting a plurality of solar cells in series so as to obtain a predetermined output voltage. The number of the solar cells connected in series in each of the power generating regions 24*a*, 24*b* and 24*c* and the output voltage thereof are the same as those of the above-mentioned power generating regions 21*a* through 23*c*. A positive wire 8 of the power generating region 24a is connected to the positive trunk cable 3, a negative wire 8 of the power generating region 24c is connected to the negative trunk cable 3, a negative wire 8 in the power generating region 24a and a positive wire 8 in the power generating region 24b are connected to each other, and a negative wire 8 in the power generating region 24b and a positive wire 8 in the power generating region 24c are connected to each other.

According to the structures as mentioned above, the size of the solar cell module 2a of FIG. 8a including three solar cell sub-modules 21, 22 and 23 is three times larger than the size of the solar cell module 2b of FIG. 8b having one solar cell sub-module 24. Besides, the solar cell module 2a is designed so that three power generating regions 21a, 21b, 21c; 22a, 22b, 22c; and 23a, 23b, 23c are respectively connected in parallel and adjacent three solar cell sub-modules 21, 22 and 23 are connected in series, and the solar cell module 2b is designed so that three power generating regions 24a, 24b and 24c are connected in series, thereby obtaining the same output voltage from both of the solar cell modules 2a and 2b.

Figure 9:
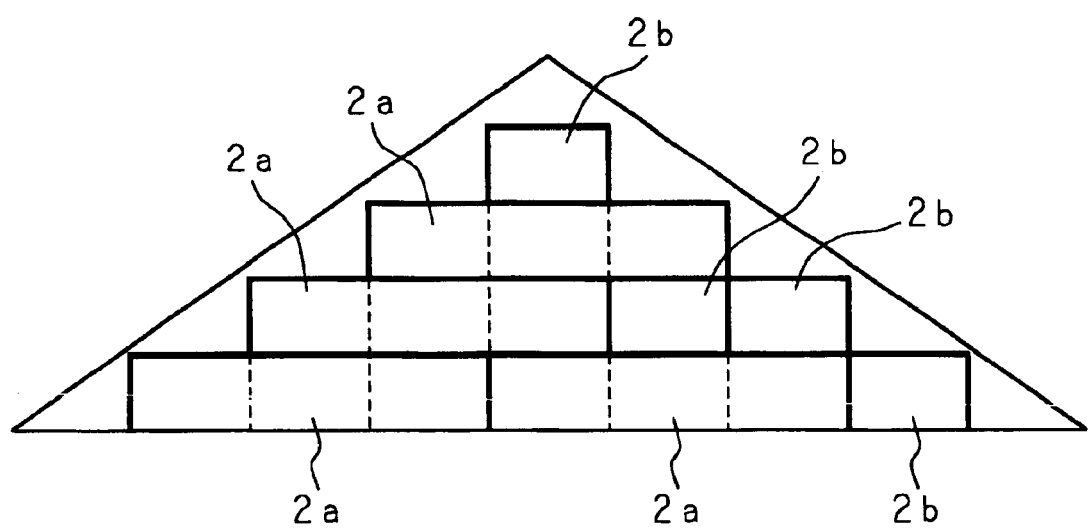
FIG. 9 is an illustration showing an installation example in which the two types of solar cell modules of the second embodiment are installed in a lateral direction of a roof.

FIG. 9 is an illustration showing an installation example in which the above-described two types of solar cell modules 2a and 2b are installed in a lateral direction of a roof. As shown in FIG. 9, as many as possible solar cell modules 2a of a larger size are successively installed in a lateral direction, and then, if there is some remaining space, one or two solar cell modules 2b of a smaller size is installed in that space. By installing the solar cell modules 2a and 2b in such a manner, like the above-described first embodiment, it is possible to reduce the time required for the installation process and the cost and to achieve efficient installation in comparison with the conventional example (FIG. 2).

Figure 10:
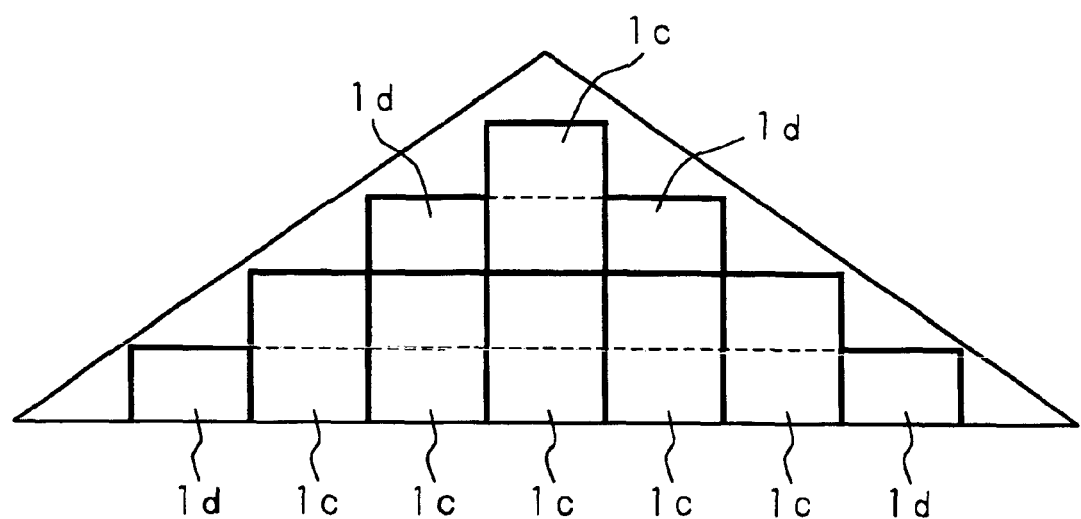
FIG. 10 is an illustration showing an installation example in which the two types of solar cell modules are installed in a vertical direction of a roof.

It should be noted that while the above-described first and second embodiments illustrate the examples where a plurality of types of solar cell modules having an equal output voltage and different sizes are installed in a lateral direction of a roof, it is certainly possible to install such solar cell modules in a vertical direction (ridge-eave direction) of the roof in the same manner. FIG. 10 shows an example of installing two types of solar cell modules 1c and 1d, that have different sizes but achieve the same output voltage by changing their internal wiring design in the same manner as in the first embodiment, in a vertical direction (ridge-eave direction) of a roof.

As shown in FIG. 10, the solar cell modules 1c of a larger size and the solar cell modules 1d of a smaller size are efficiently installed in combination in a vertical direction. It is needless to say that such an installation produces the exact same effect as that of the first embodiment.

(Third Embodiment)

Figure 11:
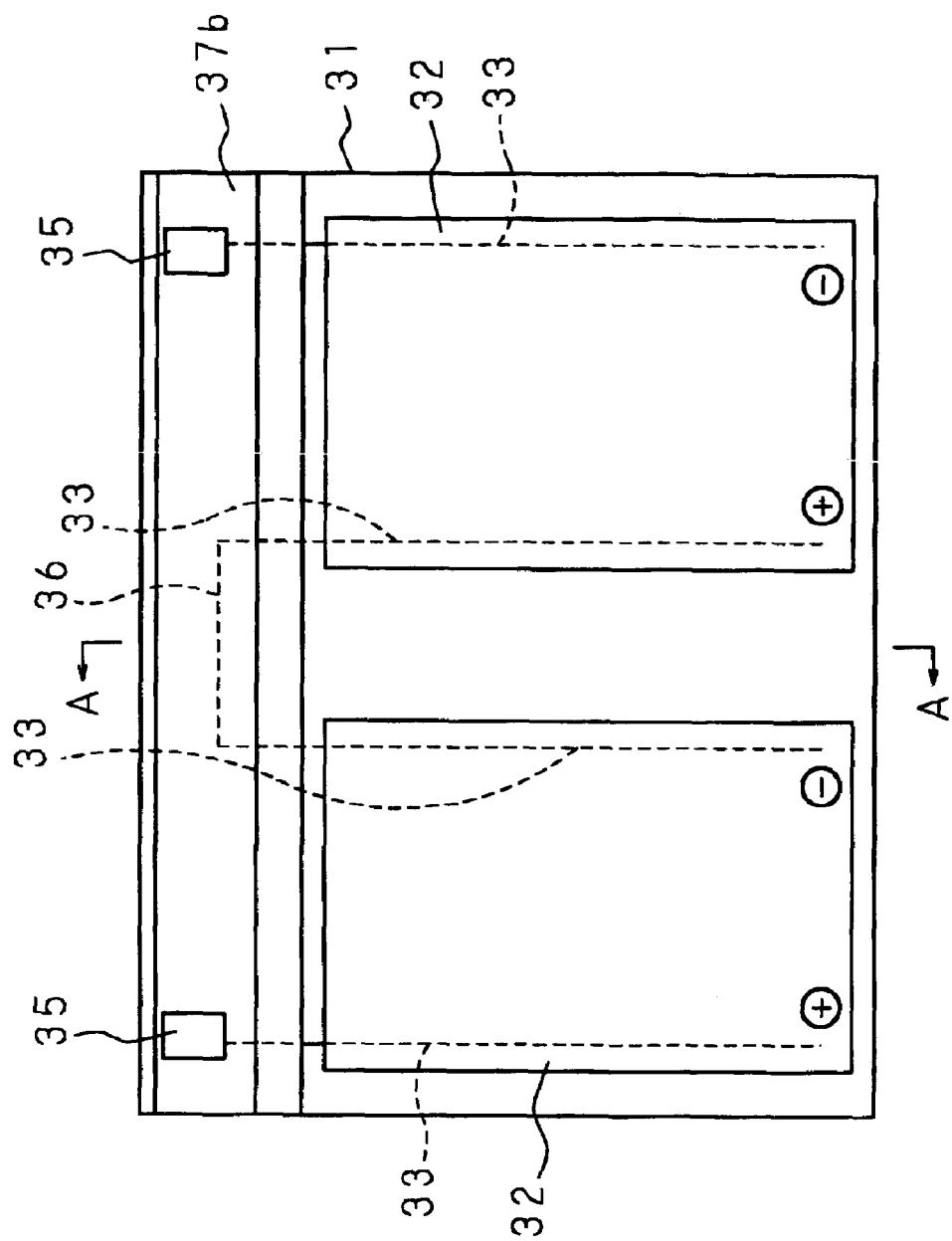
FIG. 11 is a plan view of an example of the structure of a solar cell module according to the third embodiment of the present invention.
Figure 12:
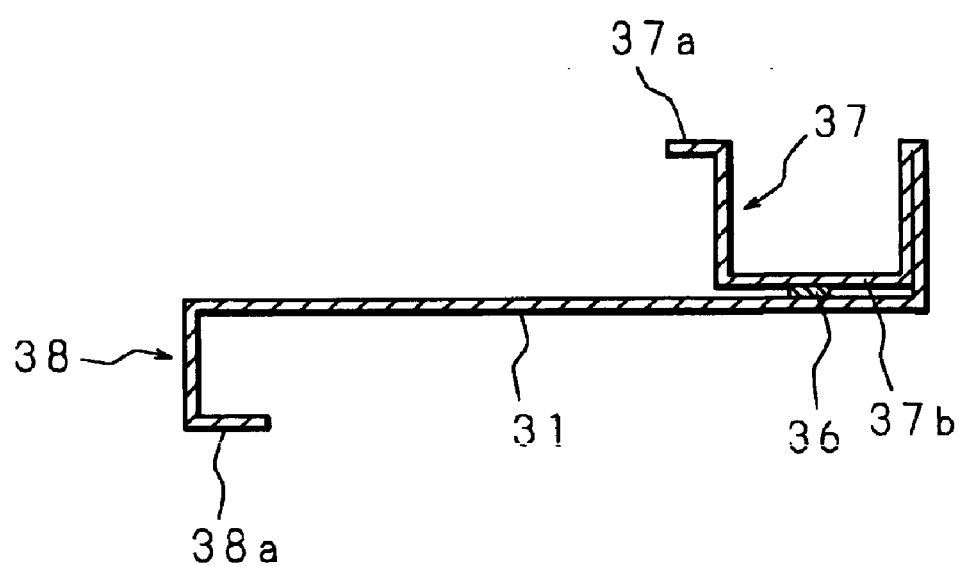
FIG. 12 is a cross section cut along the A—A line of FIG. 11.

FIG. 11 is a plan view of an example of the structure of a solar cell module according to the third embodiment of the present invention, and FIG. 12 is a cross section cut along the A—A line of FIG. 11. In these figures, numeral 31 is a metal base made of stainless steel, for example. Two solar cell sub-modules 32 are mounted on the front surface of the metal base 31. Each of the solar cell sub-modules 32 comprises a glass substrate and a plurality of solar cells arranged on the glass substrate, and is mounted on the front surface of the metal base 31 through an EVA resin. In each solar cell sub-module 32, these plurality of solar cells are electrically connected to each other, and one positive wire 33 and one negative wire 33 which are respectively coated with an insulated tape are drawn from each solar cell sub-module 32.

A raised portion 37 having a first engagement section 37a at its end is formed at one edge of the metal base 31 where the solar cell sub-modules 32 are not mounted (the ridge-side end portion when a plurality of solar cell modules are installed stepwise) by bending the metal base 31, and a suspended portion 38 having a second engagement section 38a at its end is formed at the opposing other edge (the eave-side end portion when a plurality of solar cell modules are installed stepwise) by bending the metal base 31. Further, in the process of actually installing a plurality of solar cell modules, the first engagement section 37a of the solar cell module positioned on the eave side is brought into engagement with the second engagement section 38a of the solar cell module positioned on the ridge side.

The raised portion 37 includes a base section 37b formed by bending the metal base 31 so that the base section 37b is parallel to the front surface of the metal base 31, and terminal boxes 35 are mounted on both end portions of this base section 37b. A positive wire 33 of one of the solar cell sub-modules 32 is connected to a power cable (not shown) in one of the terminal boxes 35, and a negative wire 33 of the other solar cell sub-module 32 is connected to the power cable in the other terminal box 35.

A negative wire 33 of the one solar cell sub-module 32 is extended to a position between the metal base 31 and the base section 37b of the raised portion 37, and a positive wire 33 of the other solar cell sub-module 32 is also extended to a position between the metal base 31 and the base section 37b of the raised portion 37. Further, these wires 33 are connected to each other between the metal base 31 and the base section 37b by a wiring member 36. This wiring member 36 is sealed in an EVA resin between the metal base 31 and the base section 37b. With the above-mentioned connection, the power generated by the solar cells of the respective solar cell sub-modules 32 is output.

Next, the following description will explain the moisture resistance characteristics of the solar cell module of the third embodiment and a conventional solar cell module. The solar cell module of the third embodiment (invented product) and a conventional solar cell module (conventional product) were subjected to a moisture resistance test according to JIS C 8917. This moisture resistance test was carried out by leaving the invented product and the conventional product in the conditions of a temperature of 85±2° C. and a humidity of 90 to 93±5% continuously for 1000±12 hours and 2000±12 hours. Further, parameters (maximum power: $P_{max}$, open circuit voltage: $V_{oc}$, short-circuit current: $I_{sc}$, fill factor: F. F.) were measured before and after the test, and the rate of change (the characteristic after the test/the characteristic before the test) was calculated. The results are shown in Table 1.

TABLE 1

| | TEST TIME (HOUR) | RATE OF CHANGE OF EACH PARAMETER BEFORE AND AFTER TEST (AFTER TEST/ BEFORE TEST) (%) | | | |
|---|---|---|---|---|---|
| | | Pmax | Voc | Isc | F.F. |
| INVENTED PRODUCT | 1000 | 100.7 | 99.6 | 101.5 | 99.6 |
| | 2000 | 100.3 | 99.9 | 101.0 | 99.5 |
| CONVENTIONAL PRODUCT | 1000 | 99.0 | 100.8 | 98.9 | 99.4 |
| | 2000 | 70.5 | 93.0 | 92.0 | 82.5 |

It can be understood from the results shown in Table 1 that the conventional product maintained its reliability when it was left in high-temperature and high-humidity environment for about 1000 hours, but its characteristic was considerably lowered when it was left in high-temperature and high-humidity environment for about 2000 hours. In contrast, it can be understood that the invented product kept its original characteristic as it is and maintained its long-term reliability even when it was left in high-temperature and high-humidity environment for about 2000 hours.

(Fourth Embodiment)

Figure 13:
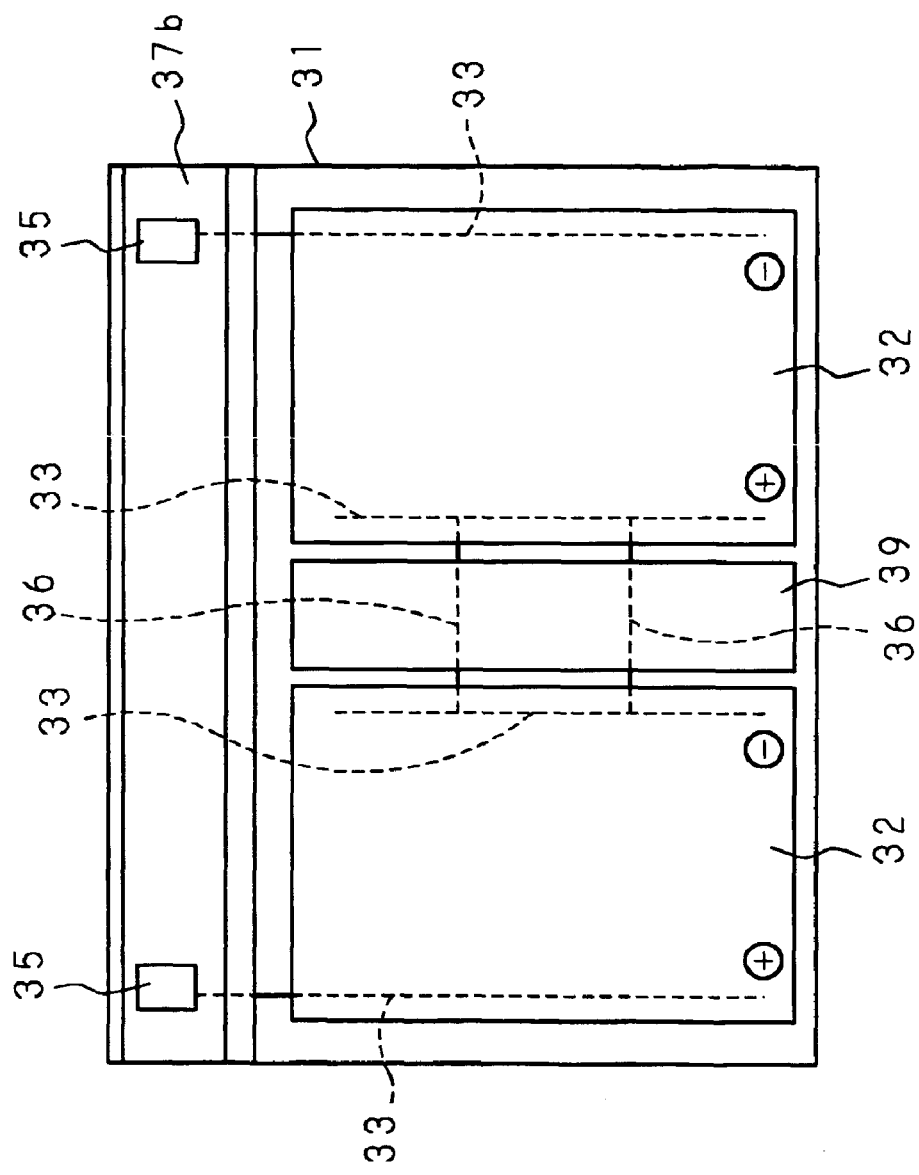
FIG. 13 is a plan view of an example of the structure of a solar cell module according to the fourth embodiment of the present invention.

FIG. 13 is a plan view of an example of the structure of a solar cell module according to the fourth embodiment of the present invention. In FIG. 13, the same members as in FIG. 11 are designated with the same codes.

In this solar cell module, the wiring member 36 is also sealed in the EVA resin layer between the metal base 31 and a moisture-impermeable cover member 39 provided on the front surface of the metal base 31. In this example, since the wiring member 36 is also sealed between the metal base 31 and the cover member 39, it is possible to produce the same effect as the third embodiment. Note that the cover member 39 can be made of any moisture impermeable material, but the cover member 39 made of a metal such as stainless steel is preferable if light resistance is taken into consideration.

It should be noted that while two solar cell sub-modules 32 are connected in the third and fourth embodiments, it is also possible to connect three or more solar cell sub-modules 32. Moreover, while the third and fourth embodiments use the EVA resin as a sticking member, it is possible to use other material.

Furthermore, the solar cells of the solar cell sub-module of the above-described embodiments may be of amorphous or crystalline type. Besides, instead of the glass substrate of the solar-cell sub-module, other material that transmit sunlight, such as a surface plastic film, may be used.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A method of installing a plurality of solar cell modules, comprising the steps of:
    preparing a plurality of solar cell modules having an equal output voltage and different sizes; and
    connecting positive and negative output lines of each solar cell module thus prepared to positive and negative cables, respectively, so as to connect the solar cell modules in parallel;
    wherein the step of preparing the plurality of solar cell modules comprises the steps of;
    providing a power generating region wherein a predetermined output voltage is obtained by connecting a plurality of solar cells in series on a supporting member;
    separating the power generating region in a direction crossing the direction of series connection of the solar cells on the supporting member;
    obtaining solar cell sub-modules of equal size by connecting the power generating regions thus separated in series or parallel on the supporting member; and
    preparing a plurality of supporting members on which mutually different numbers of solar cell sub-modules are formed and connecting the solar cell sub-modules in series or parallel on the supporting members thereby constructing the plurality of solar cell modules having an equal output voltage and different sizes.

2. The method of installing solar cell modules of claim 1, wherein the plurality of solar cell modules have mutually different internal wiring designs so as to obtain an equal output voltage.

3. A solar cell module comprising:
    a supporting member;
    a plurality of solar cell sub-modules mounted on said supporting member, each of said solar cell sub-modules including a glass substrate and a plurality of solar cells arranged on the substrate;
    a wiring member for electrically connecting said solar cell sub-modules positioned next to each other on said supporting member; and
    a moisture impermeable cover member, mounted on said supporting member, for covering said wiring member;
    said wiring member being sealed in a resin between said supporting member and said cover member.

4. A solar cell module comprising:
    a metal base;
    a plurality of solar cell sub-modules mounted on said metal base, each of said solar cell sub-modules including a plurality of solar cells;
    a raised portion which is provided at one of opposing side edges of said metal base and has a first engagement section at its end; and
    a suspended portion which is provided at the other side edge and has at its end a second engagement section that comes into engagement with the first engagement section of other solar cell module;
    wherein said solar cell sub-modules positioned next to each other are electrically connected to each other by a wiring member on said metal base, said raised portion has a base section provided parallel to a surface of said metal base, and the connection of said solar cell sub-modules by said wiring member is made between said metal base and said base section, said wiring member being sealed in a resin between said metal base and said base section, said resin also serving to bond together the metal base and base section.

* * * * *